(12) United States Patent
Bedell et al.

(10) Patent No.: US 8,891,266 B2
(45) Date of Patent: Nov. 18, 2014

(54) MONOLITHIC HIGH VOLTAGE MULTIPLIER HAVING HIGH VOLTAGE SEMICONDUCTOR DIODES AND HIGH-K CAPACITORS

(75) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 13/418,921

(22) Filed: Mar. 13, 2012

(65) Prior Publication Data

US 2013/0242627 A1    Sep. 19, 2013

(51) Int. Cl.
*H02M 7/00* (2006.01)
*H02M 7/06* (2006.01)

(52) U.S. Cl.
USPC .................. 363/59; 363/60; 363/126; 257/76

(58) Field of Classification Search
USPC ...................... 363/58–63, 125–128
See application file for complete search history.

(56) References Cited

U.S. PATENT DOCUMENTS

| | | | | |
|---|---|---|---|---|
| 3,646,408 A * | 2/1972 | Kastner | ........................ | 257/725 |
| 3,818,484 A * | 6/1974 | Nakamura et al. | ............ | 368/204 |
| 4,217,633 A * | 8/1980 | Evans, Jr. | ........................ | 363/27 |
| 4,389,703 A * | 6/1983 | Morel et al. | .................... | 363/61 |
| 4,646,338 A * | 2/1987 | Skillicorn | ..................... | 378/110 |
| 4,694,480 A * | 9/1987 | Skillicorn | ..................... | 378/119 |
| 4,734,750 A * | 3/1988 | Okamura et al. | ............. | 257/187 |
| 5,157,786 A * | 10/1992 | Muterspaugh | ................ | 455/326 |
| 5,691,556 A * | 11/1997 | Saito et al. | .................... | 257/350 |
| 5,810,325 A * | 9/1998 | Carr | ............................ | 251/30.02 |
| 6,040,610 A * | 3/2000 | Noguchi et al. | .............. | 257/392 |
| 6,067,236 A * | 5/2000 | White | ............................. | 363/16 |
| 6,589,845 B1 * | 7/2003 | Nair et al. | .................... | 438/268 |
| 7,321,242 B2 * | 1/2008 | Mandegaran et al. | .......... | 326/89 |
| 7,491,627 B2 * | 2/2009 | Beach et al. | ................. | 438/483 |
| 7,679,104 B2 * | 3/2010 | Sato et al. | .................... | 257/190 |
| 8,093,967 B1 * | 1/2012 | Wang et al. | .................... | 335/78 |
| 8,368,121 B2 * | 2/2013 | Xin et al. | ...................... | 257/195 |
| 8,564,986 B2 * | 10/2013 | Wing et al. | .................... | 363/61 |

(Continued)

OTHER PUBLICATIONS

Jin-Ping Ao, et al. A monolithic Cockcroft-Walton voltage multiplier based on AlGaN/GaN HFET structure, phys, stat. sol. (c) 4, No. 7, 2654-2657, 2007.*

(Continued)

*Primary Examiner* — Timothy J Dole
*Assistant Examiner* — Yusef Ahmed
(74) *Attorney, Agent, or Firm* — Louis J. Percello; Otterstedt, Ellenbogen & Kammer, LLP

(57) ABSTRACT

High voltage diode-connected gallium nitride high electron mobility transistor structures or Schottky diodes are employed in a network including high-k dielectric capacitors in a solid state, monolithic voltage multiplier. A superjunction formed by vertical p/n junctions in gallium nitride facilitates operation of the high electron mobility transistor structures and Schottky diodes. A design structure for designing, testing or manufacturing an integrated circuit is tangibly embodied in a machine-readable medium and includes elements of a solid state voltage multiplier.

17 Claims, 8 Drawing Sheets

(56) References Cited

U.S. PATENT DOCUMENTS

| | | | | |
|---|---|---|---|---|
| 2006/0013047 | A1* | 1/2006 | Sudou | 365/189.09 |
| 2007/0063706 | A1* | 3/2007 | Frederick et al. | 324/414 |
| 2008/0023706 | A1* | 1/2008 | Saito et al. | 257/76 |
| 2009/0045438 | A1* | 2/2009 | Inoue et al. | 257/192 |
| 2009/0051394 | A1* | 2/2009 | Reynolds et al. | 327/119 |
| 2010/0069020 | A1* | 3/2010 | Koya et al. | 455/78 |
| 2010/0307572 | A1* | 12/2010 | Bedell et al. | 136/255 |
| 2011/0080778 | A1* | 4/2011 | Toda | 365/163 |
| 2011/0133177 | A1* | 6/2011 | Suzawa et al. | 257/43 |
| 2011/0169332 | A1* | 7/2011 | Wallmeier | 307/31 |
| 2011/0186909 | A1* | 8/2011 | Tsai et al. | 257/173 |
| 2011/0205790 | A1* | 8/2011 | Toda | 365/163 |
| 2011/0284862 | A1* | 11/2011 | Zhang | 257/76 |
| 2012/0099370 | A1* | 4/2012 | Toda | 365/163 |
| 2012/0241819 | A1* | 9/2012 | Zhang | 257/195 |
| 2013/0069708 | A1* | 3/2013 | Koya et al. | 327/427 |
| 2013/0076322 | A1* | 3/2013 | Tateno et al. | 323/271 |
| 2013/0146891 | A1* | 6/2013 | Xin et al. | 257/76 |
| 2013/0187561 | A1* | 7/2013 | Franck et al. | 315/201 |

OTHER PUBLICATIONS

Y. Niiyama, Normally off operation GaN-based MOSFETs for power electronics applications,Semicond. Sci. Technol., 25 (2010).

W. Huang, Lateral Implanted RESURF GaN MOSFETs with BV up to 2.5 kV, Proceedings of the 20th International Symnposium on Power Semiconductor Devices and ICs, May 18-22, 2008.

Y. Niiyama, Si Ion Implantation into Mg-Doped GaN for Fabrication of Reduced . . . Effect Transistors, Japanese Journal of Applied Physics, vol. 47, No. 7, pp. 5409-5416, 2008.

Z. Li, Drift region optimization in high-voltage GaN MOS-gated HEMTs, Phys. Status Solidi C 8, No. 7-8, pp. 2436-2438 (2011).

H. Ishida, Unlimited High Breakdown Voltage by Natural Super Junction of Polarized Semiconductor, IEEE Electron Device Letters, vol. 29, No. 10, Oct. 2008.

Hidetoshi Ishida, GaN-based Natural Super Junction Diodes with Multi-channel Structures, IEEE Internationl Electron Devices Meeting, Dec. 15-17, 2008.

T. Ueda, Polarization engineering in GaN power transistors, Phys. Status Solidi B 247, No. 7, pp. 1735-1739 (2010).

Shreepad Karmalkar, Resurf AlGaN/GaN HEMT for High Voltage Power Switching, IEEE Electron Device Letters, vol. 22, No. 8, Aug. 2001.

Jin-Ping Ao, et al. A monolithic Cockcroft-Walton voltage multiplier based on AlGaN/GaN HFET structure,phys. stat. sol. (c) 4, No. 7, 2654-2657, 2007.

A. Sattu, et al. Low loss AlInN/GaN Monolithic Microwave Integrated Circuit Switch,978-1-61284-244—Aug. 11, 2011 IEEE.

José V. Siles, et al. Capabilities of GaN Schottky Multipliers for LOPower Generation . . . Bands, 19th Intern'l Symposium on Space Terahertz Technology, Groningen, Apr. 28-30, 2008.

W. E. Hoke, et al.Monolithic integration of silicon CMOS and GaN transistors in a current mirror circuit,J. Vac. Sci. Technol. B 30(2), Mar./Apr. 2012.

Stephen W. Bedell et al., unpublished U.S. Appl. No. 13/418,438, filed Mar. 13, 2012, Gallium Nitride Superjunction Devices.

Stephen W. Bedell et al., unpublished U.S. Appl. No. 13/418,476, filed Mar. 13, 2012, Breakdown Voltage Multiplying Integration Scheme.

* cited by examiner

MONOLITHIC HIGH VOLTAGE MULTIPLIER HAVING HIGH VOLTAGE SEMICONDUCTOR DIODES AND HIGH-K CAPACITORS

FIELD OF THE INVENTION

The present invention relates to the physical sciences and, more particularly, to voltage multipliers.

BACKGROUND

Voltage multipliers are electrical circuits used for conversion of AC electrical power to a higher DC voltage. High voltage conversion of AC signals to DC signals requires diode and capacitor elements with high breakdown voltages hampering the monolithic integration of such high voltage multipliers with solid-state components. Cockcroft-Walton voltage multipliers including multiple stages have been used for conversion of high voltage signals. Due to high voltage requirements of the diodes and capacitors within such multipliers, discrete elements are used.

BRIEF SUMMARY

Principles of the invention provide a solid-state monolithic voltage multiplier comprised of high-voltage semiconductor diodes and metal-insulator-metal (MIM) or metal-insulator-semiconductor (MIS) high-k dielectric capacitors and a design structure tangibly embodied in a machine-readable medium for designing, manufacturing, or testing an integrated circuit including such components.

A solid state monolithic voltage multiplier in accordance with a first aspect includes a voltage input, a voltage output, a plurality of high-voltage semiconductor diodes, a plurality of metal-insulator-metal or metal-insulator-semiconductor high-k capacitors, and pathways electrically connecting the diodes and capacitors. The diodes, capacitors and pathways are configured as a network to convert AC electrical power having a first voltage to a higher second DC voltage.

A design structure is tangibly embodied in a machine-readable medium for designing, manufacturing, or testing an integrated circuit in accordance with another aspect. The design structure includes a voltage input, a voltage output, a plurality of high-voltage semiconductor diodes, a plurality of metal-insulator-metal or metal-insulator-semiconductor high-k capacitors, and pathways electrically connecting the diodes and capacitors. The diodes, capacitors and pathways are configured as a network to convert AC electrical power having a first voltage to a higher second DC voltage.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided. For example, one or more embodiments may provide one or more of the following advantages:

High frequency operation;
Reduced voltage loss;
High breakdown voltage.
Monolithic integration (wafer scale)

These and other features and advantages of the present invention will become apparent from the following detailed description of illustrative embodiments thereof, which is to be read in connection with the accompanying drawings.

DETAILED DESCRIPTION

Monolithic high voltage multipliers comprised of high-voltage semiconductor diodes or diode-connected high electron mobility transistors and metal-insulator-metal (MIM) or metal-insulator-semiconductor (MIS) high-k dielectric capacitors are disclosed. The use of such diodes and capacitors facilitates the monolithic integration of high voltage multiplier circuits with solid-state components while allowing the use of diode and capacitor elements with high breakdown voltages. Schottky diodes including gallium nitride (GaN) superjunction layers are among the high-voltage semiconductor diodes that facilitate circuit operation.

Figure 1:
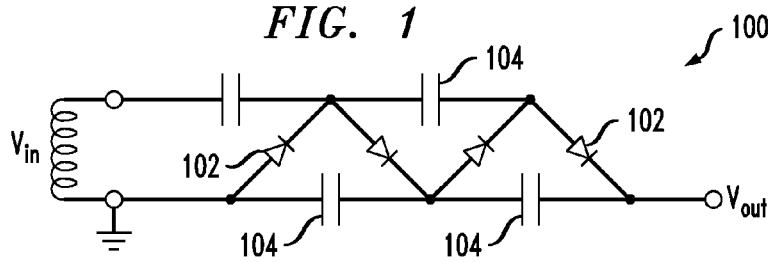
FIG. 1 shows a schematic illustration of a monolithic voltage multiplier circuit including high voltage semiconductor diodes and metal-insulator-metal or metal-insulator-semiconductor high-k dielectric capacitors.

FIG. 1 shows an exemplary embodiment of a voltage multiplier 100 comprised of diodes 102 and capacitors 104 as described further below. Circuits having this configuration have been generally referred to as Cockcroft-Walton voltage multipliers. The diodes and capacitors are configured to provide AC to DC conversion of high voltage signals. The embodiment of FIG. 1 has two stages and is accordingly designed to approximately double the DC voltage that would have been obtained from a single state rectifier. Multipliers having more than two stages can also be fabricated. Multipliers having other circuit designs comprising diodes and capacitors are also known. Due to high voltage requirements of the diodes and capacitors in such circuits, discrete elements have commonly been used. In contrast, a monolithically integrated multiplier 100 is provided herein through use of diodes and capacitors as described below. Such multipliers can be produced on a wafer using semiconductor processing techniques familiar to those of skill in the art followed by cutting of the wafer to provide individual devices such as the voltage multiplier 100 in this exemplary embodiment. Accordingly, the base material (substrate or wafer) contains the pathways and active elements (the diodes 102 and capacitors 104) configured to provide voltage multiplication.

High electron mobility transistors (HEMT) are disclosed that are characterized by high breakdown voltages. In exemplary embodiments, a gallium nitride superjunction is provided between the channel and the substrate, suppressing breakdown both through the substrate and between the gate and drain. As employed in the voltage multipliers discussed herein, the gates and drains of the HEMT structures are electrically connected. Exemplary embodiments of Schottky diode structures including doped gallium nitride superjunction layers are also disclosed for use in the multiplier 100.

Figure 2:
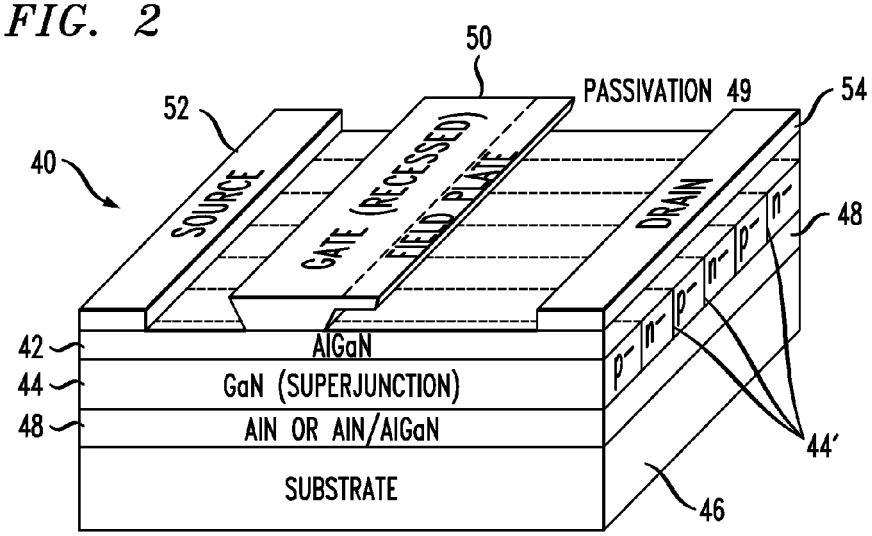
FIG. 2 shows a schematic illustration of a high electron mobility transistor structure that may be used as a diode in a voltage multiplier circuit by electrical connection of the gate and drain.

A first exemplary embodiment is shown in the schematic illustration provided in FIG. 2. The HEMT structure 40 shown in FIG. 2 includes a barrier layer of aluminum gallium nitride (AlGaN) 42 adjoining a gallium nitride superjunction layer 44 formed by p/n junctions 44' in the GaN. More specifically, the entirety of the GaN material between the channel and the substrate 46 is a superjunction comprised of p/n junctions 44' that extend vertically with respect to the top surface of the substrate and the bottom surface of the barrier layer. In operation, the channel is formed inside the GaN layer close to the GaN/AlGaN interface. Due to the two-dimensional quantum confinement of electrons in the channel, the channel is typically referred to as two dimensional electron gas, or 2 DEG. The doped GaN p/n junctions 44' extend vertically with respect to the channel electric field. Current flows in both the p- and n-GaN parallel to each other when voltage is applied to the gate 50, also known as the gate electrode. Channel conduction mode in the n- and p- GaN layers is accumulation and inversion, respectively. The electric field set up by the GaN superjunction is vertical to the electric field set up between the gate and the drain, and also vertical to the electric field set up between the drain and the Si(111) substrate. As known from the theory of superjunctions, the spatial distribution of an electric field vertical to that set up by the superjunction is modified in such a way that the maximum value of the vertical electric field in the GaN material is reduced. As a result, the breakdown voltage is increased accordingly. This applies to both the electric field set up between the gate and the drain and the electric field set up between the gate and the Si(111) substrate.

The gate 50 adjoins the aluminum gallium nitride barrier layer 42, though a dielectric layer (not shown) may be provided beneath the gate 50 to form a metal-insulator-semiconductor (MIS) HEMT structure. The gate may optionally be recessed to further reduce the electric field on the drain side of the gate (not shown). A field plate extends from the gate and extends over the barrier layer 42. Field-plates are widely used in high voltage devices including GaN HEMTs to reduce the electric field on the drain side of the gate and suppress premature breakdown between the gate and the drain. However, since as used in a voltage multiplier as disclosed herein the gate and drain terminals are electrically connected, breakdown on the drain side of the gate is less likely. When the gate and drain terminals are electrically connected, voltage drop on the drain side of the gate is equal to the product of the drive current and the access resistance of the drain. As known in the art, parameters such as the contact resistance between the drain terminal (e.g. metal or silicide) and the channel, spreading resistance (due to current crowding effects) and the on-resistance of the portion of the channel between gate and drain terminals contribute to the access resistance. Therefore, in some embodiments wherein the access resistance is high, and/or the drive current is high, field-plates may be still beneficial. Source and drain electrodes 52, 54 are also formed on the AlGaN barrier layer 42. A buffer layer 48 is formed between the substrate 46 and the GaN superjunction layer 44. The buffer layer 48 in this illustrative embodiment is formed of aluminum nitride (AlN). It will be appreciated that both the barrier and buffer layers can be formed of materials other than those identified above. For example, the barrier layer can be comprised of any suitable material that will grow on gallium nitride and provide a large band gap. Other materials which may be used as the barrier layer include but are not limited to AlInN, AlGaInN, AlN/AlInN bilayer or superlattice. The buffer layer can be any material that has a smaller lattice mismatch with the substrate material compared to that of GaN with the substrate material, and therefore reduces the built-in strain in GaN.

The substrate 46 in this exemplary embodiment is preferably comprised of Si(111), although other substrate materials known to those of skill in the art such as silicon carbide (SiC), sapphire or zinc oxide (ZnO) could alternatively be employed. A GaN substrate could alternatively be used, eliminating the need for any additional GaN growth. Si(111) is the preferred substrate material because of its significantly lower cost and superior thermal conductivity. However, the growth of GaN on Si(111) is challenging due the lattice mismatch between GaN and Si(111), and buffer layers such as AlGaN or AlN are typically grown on Si(111) prior to GaN growth to reduce the lattice mismatch. The lattice mismatch between GaN and Si(111) results in mechanical strain in the GaN layer leading to the creation of structural defects in GaN after a critical strain level is reached. The defects degrade the electrical properties of the GaN layer such as carrier mobility and the critical electric field (and therefore the inherent breakdown voltage of GaN). The accumulation of the mechanical strain in GaN also results in the bowing of the substrate (and the layers grown on the substrate) and may lead to the cracking and delamination of the layers. Since the accumulated strain is increased as the thickness of the grown layers is increased, the thickness of the GaN channel material is typically limited to less than ten (10) microns. Therefore, the GaN-on-Si HEMT devices are particularly prone to breakdown through the Si substrate (i.e. breakdown between the drain and Si substrate, through the GaN channel material; hence, typically the thinner the GaN layer, the lower the breakdown voltage). The improvements disclosed herein are accordingly particularly relevant to GaN-on-Si devices which are most prone to breakdown though the substrate. Breakdown between gate and drain is in principle independent of the substrate type and is suppressed by employing a superjunction structure as disclosed herein, regardless of the type of the substrate material being used.

A second AlGaN layer may be provided beneath the GaN layer 44 to form a double heterojunction HEMT (DH-HEMT) in an alternative embodiment, in which case the layer 48 shown in FIG. 2 would actually comprise two layers, specifically the AlN buffer layer and the second AlGaN layer. Alternatively, an AlN/GaN supperlattice, an AlInN layer, an AlGaInN layer, or an InGaN layer may be used instead of the second AlGaN layer. A passivation layer 49 is provided on the structure 40 and overlies the barrier layer 42. The passivation layer is comprised of silicon nitride in this exemplary embodiment. The presence of the GaN superjunction layer 44 in the HEMT structure shown in FIG. 2 enhances the voltage sustaining level in the GaN beyond the Poisson limit and improves the breakdown voltage of the structure 40. The superjunction serves to suppress breakdown both through the substrate and between the gate and drain. Low-resistivity contacts between source/drain and the channel material (GaN) may be achieved by various techniques used for conventional GaN HEMT devices as known in the art (not shown in the figures). Examples include but are not limited to opening contact vias in the AlGaN barrier layer, doping the AlGaN barrier layer with Al, forming metal-semiconductor alloys using thermal treatment, and combinations thereof at/underneath source and drain terminal regions.

The embodiment of FIG. 2 is prepared by growing the buffer, superjunction and barrier layers on the substrate 46. Metal organic chemical vapor deposition (MOCVD), molecular beam epitaxy (MBE) and/or other techniques familiar to those of skill in the art may be employed. The superjunction can be formed by growing n– GaN, followed by masked implantation and/or diffusion to form the p– GaN layers. The n-type conductivity of GaN may arise from the presence of defects such as vacancies or Si dopant atoms in GaN. An exemplary process flow is shown in FIG. 3.

Figure 3:
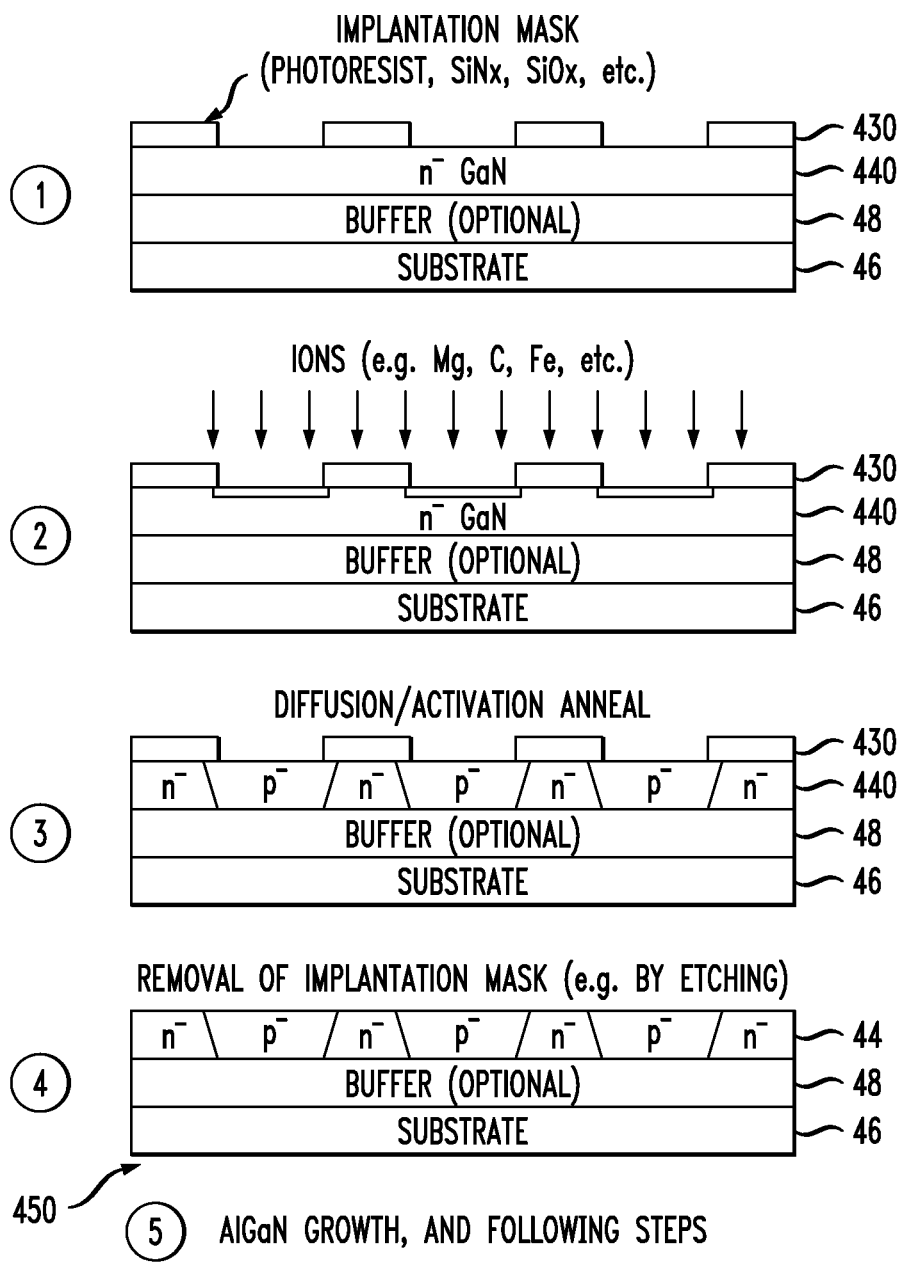
FIG. 3 is a flow diagram showing an exemplary process for fabricating the high electron mobility transistor structure of FIG. 2.

Referring to step 1 in FIG. 3, the substrate 46 has a n-GaN layer 440, the optional buffer layer 48, and an implantation mask 430 formed thereon. In step 2, ions are implanted in the n-GaN layer 440. The ions may be, for example, magnesium or zinc. In step 3, the ions are distributed within the n-GaN layer through processes known to those of skill in the art, namely diffusion and/or activation anneal in the exemplary process. Activation anneal places dopant atoms on lattice sites. Distribution of the dopant atoms is such that n-GaN regions remain in the layer 440 beneath the implantation mask. The entirety of the thickness of the GaN material is a superjunction structure following step 3. The implantation mask 430 is removed in step 4, leaving a structure 450 comprising the substrate 46, optional buffer layer 48 and GaN superjunction layer 44. It will be appreciated that the vertical p/n junctions formed in this procedure are not entirely orthogonal to the buffer layer 48 nor will they be orthogonal to the barrier layer subsequently formed thereon. Orthogonal junctions are not required. The AlGaN barrier layer 42 can thereafter be grown on the structure 450 in step 5. It will be appreciated that fabrication process as described above can be conducted on a wafer scale.

Figure 4:
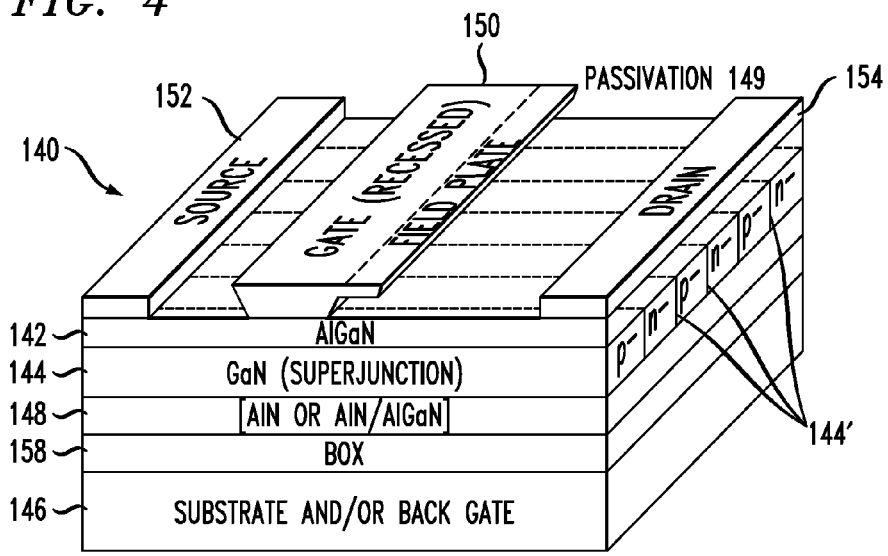
FIG. 4 shows a schematic illustration of an alternative embodiment of a high electron mobility transistor structure that may be used as a diode in a voltage multiplier circuit by electrical connection of the gate and drain.

A further exemplary embodiment of a HEMT structure 140 is shown in FIG. 4. The structure shown in FIG. 4 includes a barrier layer of aluminum gallium nitride (AlGaN) 142 adjoining a doped gallium nitride superjunction layer 144 formed by p/n junctions 144' in the GaN. As discussed above with respect to the embodiment of FIG. 2, other large band gap materials could be employed for the barrier layer. Similar to the embodiment of FIG. 2, the entirety of the GaN material between the conductive channel and the substrate 146 is a superjunction. The doped GaN p/n junctions 144' extend vertically with respect to the channel electric field. The junctions of the n– and p– regions may be oriented as shown in FIG. 3, which is considered vertical with respect to this element. Current flows in both the p- and n-GaN parallel to each other when voltage is applied to the gate 150. The gate 150 adjoins the aluminum gallium nitride layer 142, though a dielectric layer (not shown) may be provided beneath the gate 150 to form a metal-insulator-semiconductor (MIS) HEMT structure. The gate may optionally be recessed (not shown).

Source and drain electrodes 152, 154 are also formed on the AlGaN barrier layer 142. The gate and drain are electrically connected when the structure is used as a diode in a voltage multiplier. A buffer layer 148 is formed between the substrate 146 and the GaN superjunction layer 144. The buffer layer 148 in this illustrative embodiment is formed of aluminum nitride (AlN). A passivation layer 149 is provided on the structure 140. The passivation layer is comprised of silicon nitride in this exemplary embodiment. The source 152 may overlap the gate, running over the passivation layer 149 to overlap the channel on the drain side of the gate 150, to form a second field plate (not shown). In the embodiment of FIG. 4, the structure is detached from the substrate and bonded to an insulating or insulator-on-semiconductor substrate such as silicon-dioxide on Si. Such a substrate may be formed by various methods known in the art, such as thermal oxidation of the Si substrate followed by removal of the oxide from one side; deposition or growth of oxide or nitride on one side of the Si substrate; or using a Si on insulator (SOI) substrate in which a top thin Si layer has been etched away. In the case of insulator on Si, the Si substrate can serve as a back gate, which may improve the electrostatics of the transistor, including the reduction of the off-current. The back gate bias may also be used for adjusting the threshold voltage of the transistor, as known in the art. This may be particularly useful in the case of DH-HEMT devices. To use the HEMT as a diode, one would typically connect the back gate electrically to the front gate (which is connected electrically to the drain); however, it is also possible to apply an independent voltage bias to the back gate (for example for adjusting the threshold voltage of the HEMT device). Layer transfer may be achieved by spalling or other known techniques. U.S. Pub. No. 2010/0307572 discloses layer transfer techniques applicable to fabrication of the structure 140, and is incorporated by reference herein. The presence of the GaN superjunction layer 144 in the HEMT structure shown in FIG. 4 enhances the voltage sustaining level in the GaN beyond the Poisson limit and improves the breakdown voltage of the structure 140. The superjunction serves to suppress breakdown both through the substrate and between the gate and drain. The embodiment of FIG. 4 allows for even higher breakdown voltages due to the insulating buried oxide (BOX) layer 158 that helps prevent the permeation of the depletion region into the substrate that could otherwise result in premature breakdown through the Si substrate. This embodiment is also advantageous in that it allows thinner GaN layers to be used compared to embodiment of FIG. 2, due to the presence of the BOX layer. Growing thinner GaN layers on Si is less demanding since the accumulated strain due to lattice mismatch is increased as the thickness of the GaN layer grown on Si is increased. As in the embodiment of FIG. 2, the superjunction serves to suppress breakdown both through the substrate and between the gate and drain, not just between the gate and drain. Like the other embodiment disclosed herein, the embodiment of FIG. 4 can be formed as a double heterojunction HEMT.

The p– regions forming the superjunction in GaN may be doped by impurities such as Mg and Zn. The doping levels of the p– regions may range from $5 \times 10^{15}$ cm$^{-3}$ to $5 \times 10^{17}$ cm$^{-3}$ but higher or lower doping levels are also possible. The widths of the p– regions may range from 500 nm to 5 µm but thinner or wider regions are also possible. The n– regions forming the superjunction in GaN may be doped by impurities such as Si or result from the defects present in GaN. The doping levels of the n– regions may range from $10^{15}$ cm$^{-3}$ to $5 \times 10^{16}$ cm$^{-3}$ but higher or lower doping levels are also possible. The widths of the n– regions may range from 500 nm to 3 µm but thinner or wider regions are also possible.

GaN superjunction as formed in the manner disclosed in FIG. 3 can be employed to form diode structures. The gate and drain electrodes of the embodiments of FIGS. 2 and 4 are electrically connected to function as diodes when incorporated within a voltage multiplier such as the voltage multiplier 100 shown in FIG. 1.

Figure 5:
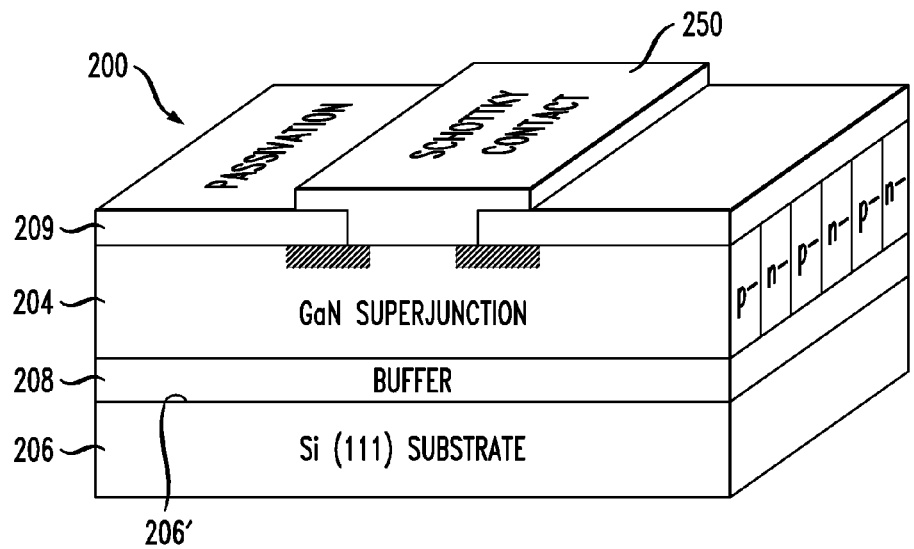
FIG. 5 shows a schematic illustration of a Schottky diode structure usable in an exemplary embodiment of a voltage multiplier circuit.
Figure 6:
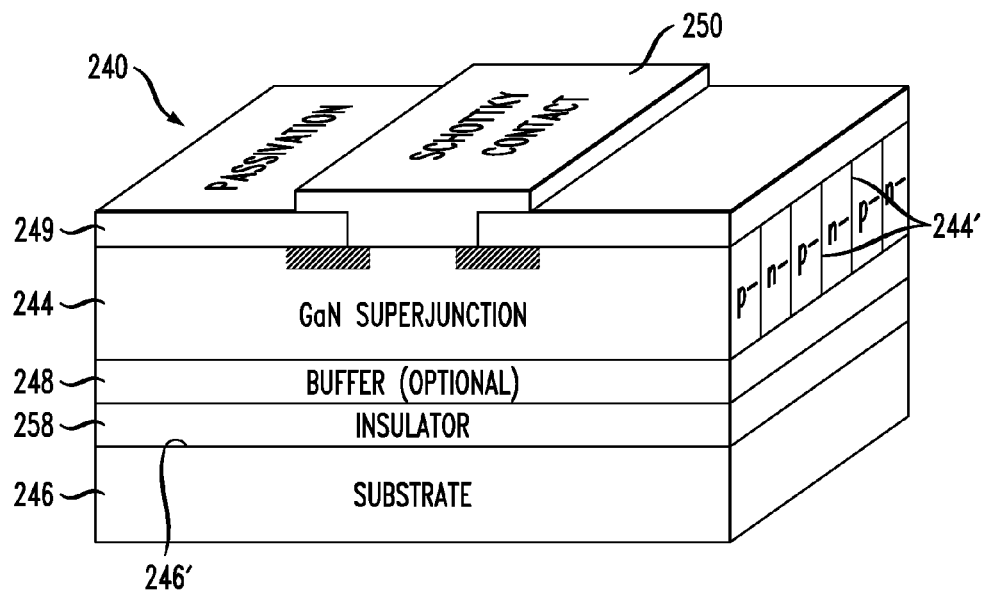
FIG. 6 shows a schematic illustration of a Schottky diode structure usable in another exemplary embodiment of a voltage multiplier circuit.

FIGS. 5 and 6 show schematic illustrations of Schottky diode structures 200, 240 including doped gallium nitride superjunction layers usable as the diodes 102 in the voltage multiplier 100 shown in FIG. 1. Referring first to FIG. 5, the exemplary structure includes a doped gallium nitride superjunction layer 204, a Si(111) substrate layer 206, and a buffer layer 208 therebetween. The buffer layer may comprise aluminum nitride. An ion-implanted guard ring 210 provided in the GaN layer 210 helps prevent damage to the Schottky junction. The implantation of argon may be conducted in the fabrication of the structure 200 to create a high resistivity area. Implantation of other ions such as magnesium or zinc is an alternative approach. Argon, magnesium and zinc are non-limiting examples. Those skilled in the art will appreciate that guard rings are well known features of Schottky diodes. A passivation layer 209 is formed on the GaN layer 204. A Schottky contact 250 adjoins the doped GaN superjunction layer 204, forming a Schottky barrier. The doped GaN superjunction layer 204 is similar to those employed in the HEMT structures described above with respect to FIGS. 2, 3 and 4. It is comprised of a plurality of p– and n– regions having junctions that extend vertically between the buffer layer 208 and the passivation layer 209 or Schottky contact 250. The junctions may extend orthogonally to the direction shown in FIG. 5. As discussed above with respect to FIG. 3, the junctions are unlikely to be perpendicular with respect to the top surface 206' of the substrate layer or adjoining layers due to the manner in which they are formed. It will accordingly be appreciated that the schematic illustrations provided herein, such as FIG. 5, may not be to scale or show boundaries between elements in precise orientations. The superjunction layer 204 in this exemplary embodiment has a thickness of less than ten microns, the entire thickness comprising a superjunction structure. The substrate layer 206 in this exemplary embodiment is Si(111), though other substrate materials known to those of skill in the art may be employed.

The Schottky diode structure 240 of FIG. 6 includes substrate, insulator, doped gallium nitride superjunction and passivation layers 246, 258, 244 and 249, respectively, and an optional buffer layer 248. The doped gallium nitride superjunction layer is the same in structure as the layer 204 discussed above with respect to FIG. 5. The junctions 244' extend vertically with respect to the top surface 246' of the substrate and the bottom surface of the passivation layer. The insulator 258 may be a buried oxide (BOX) layer.

Figure 7A:
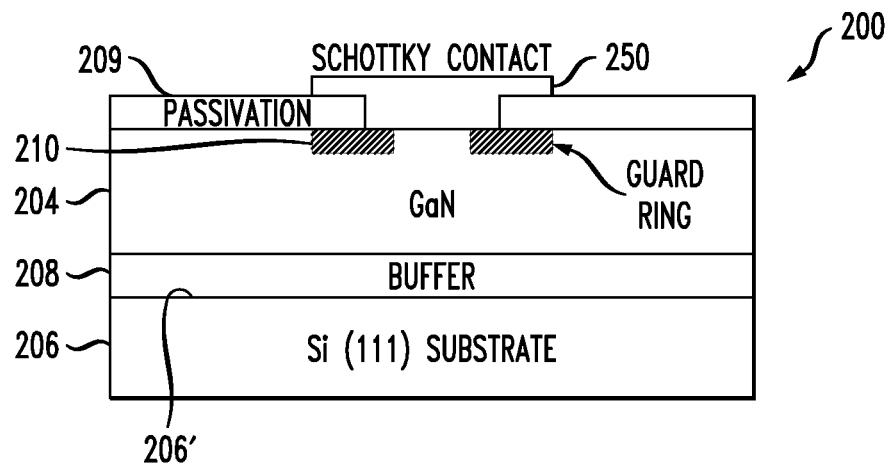
FIGS. 7A-C show exemplary embodiments of Schottky diode structures usable in exemplary embodiments of voltage multiplier circuits.
Figure 7B:
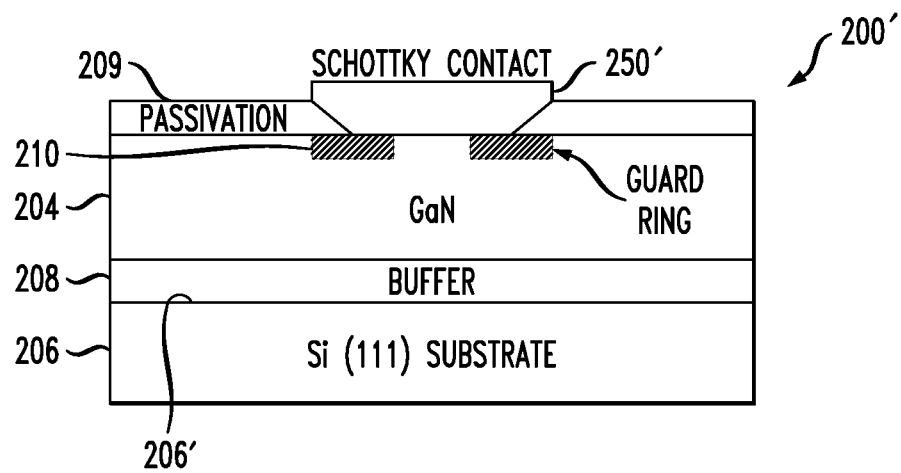

FIGS. 7A and 7B are schematic illustrations of similar Schottky diode structures that may alternatively be employed as the diodes 102 in FIG. 1. The structure 200 shown in FIG. 7A is the same structure as shown in FIG. 5 though the junctions in the doped gallium nitride superjunction layer 204 are not visible in this view. Such junctions would be visible in this view if they were formed orthogonally with respect to the directions in which the junctions in this exemplary embodiment are formed, and could resemble the vertical junctions formed in the GaN layer shown in FIG. 3. FIG. 7B shows a Schottky diode structure 200' having the same structure as the structure 200 shown in FIG. 7A except for the configuration of the Schottky contact 250' and adjoining passivation layer.

Figure 7C:
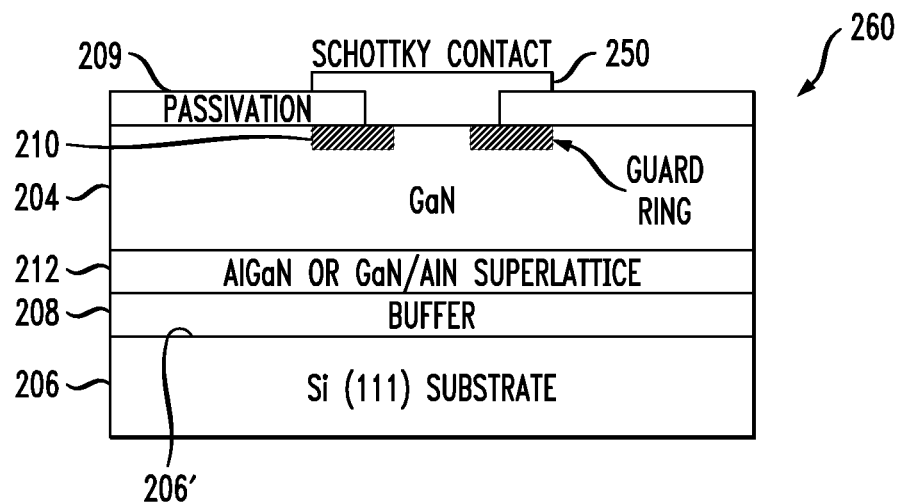

FIG. 7C shows a Schottky diode structure 260 having elements in common with the structures shown in FIGS. 7A and 7B, the same reference numbers being used to designate such elements. The structure 260 further includes an AlGaN layer or a GaN/AlN superlattice layer 212 between the buffer layer 208 and the doped gallium nitride superjunction layer 204.

Figure 8:
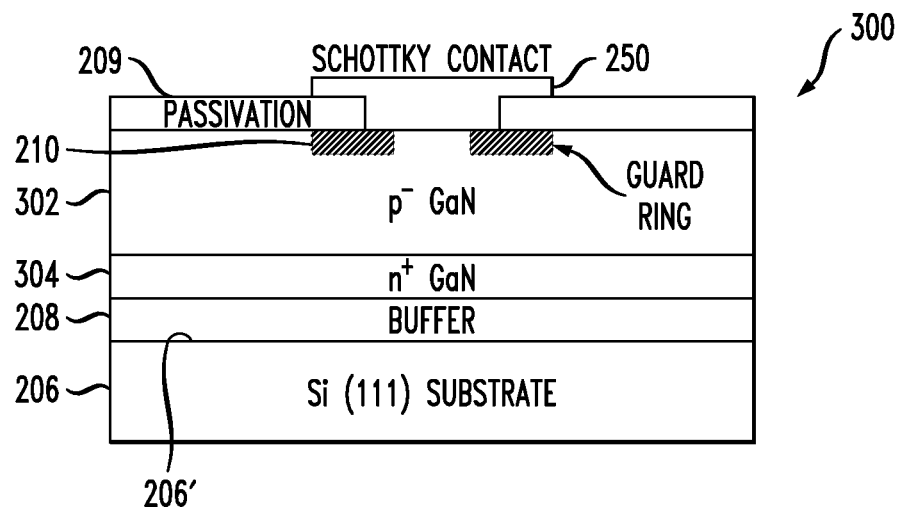
FIG. 8 shows a further exemplary embodiment of a Schottky diode structure usable in an exemplary embodiment of a voltage multiplier circuit.

FIG. 8 shows a schematic illustration of a high voltage (>1 kV) Schottky diode structure 300 having a number of elements common to those found in the structures shown in FIGS. 7A-7C. The same reference numerals are employed to identify the common elements. Unlike the structures shown in FIGS. 7A-7C which employ GaN superjunction layers, the gallium nitride layer in the structure 300 is instead comprised of a p– GaN layer 302 and an adjoining n+ GaN layer 304. GaN-on-Si Schottky diode structures as exemplified by structure 300 are known to those of skill in the art.

Figure 9:
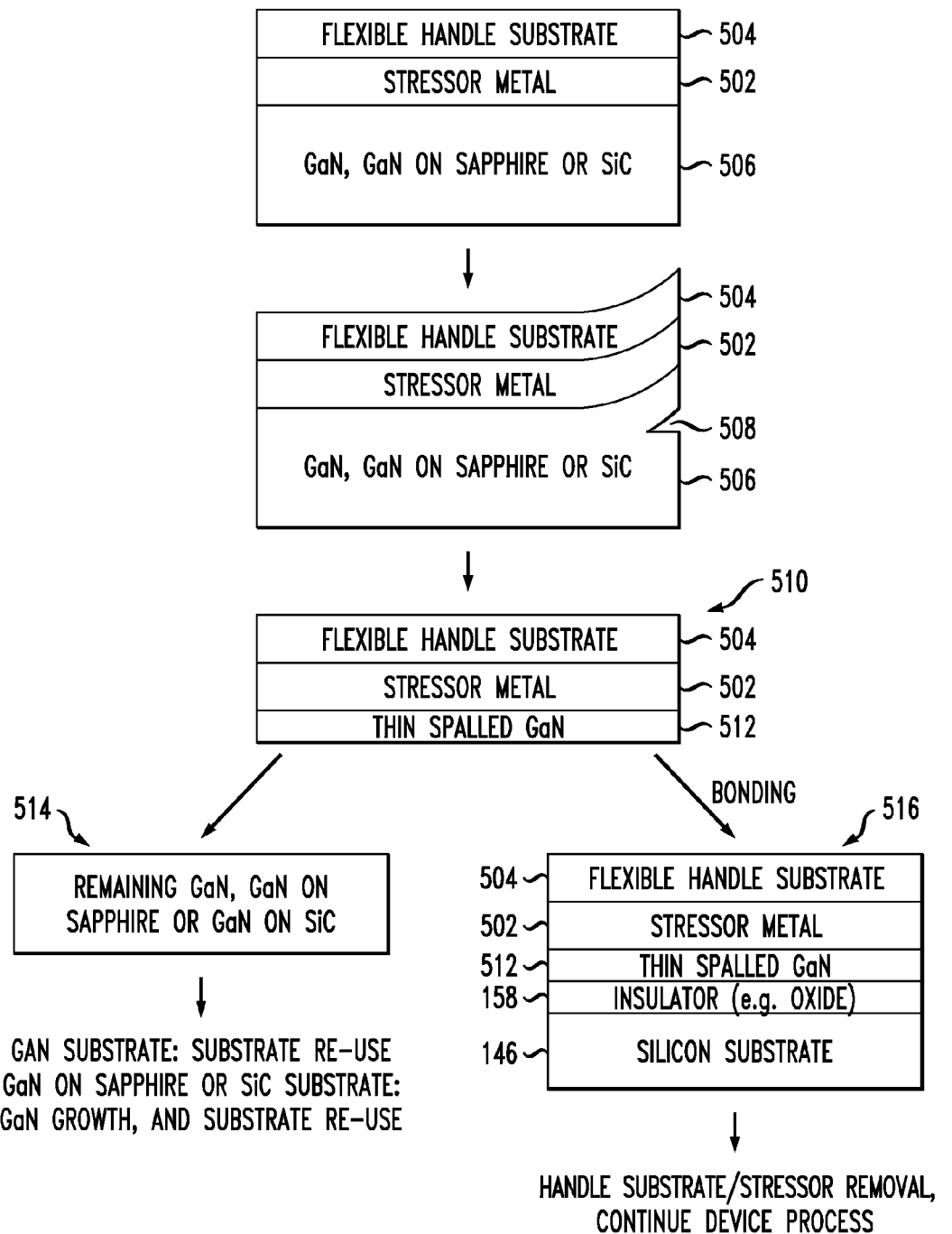
FIG. 9 is a flow diagram showing an exemplary process for fabricating a structure useful for constructing a high electron mobility transfer structure or a Schottky diode structure.
Figure 10:
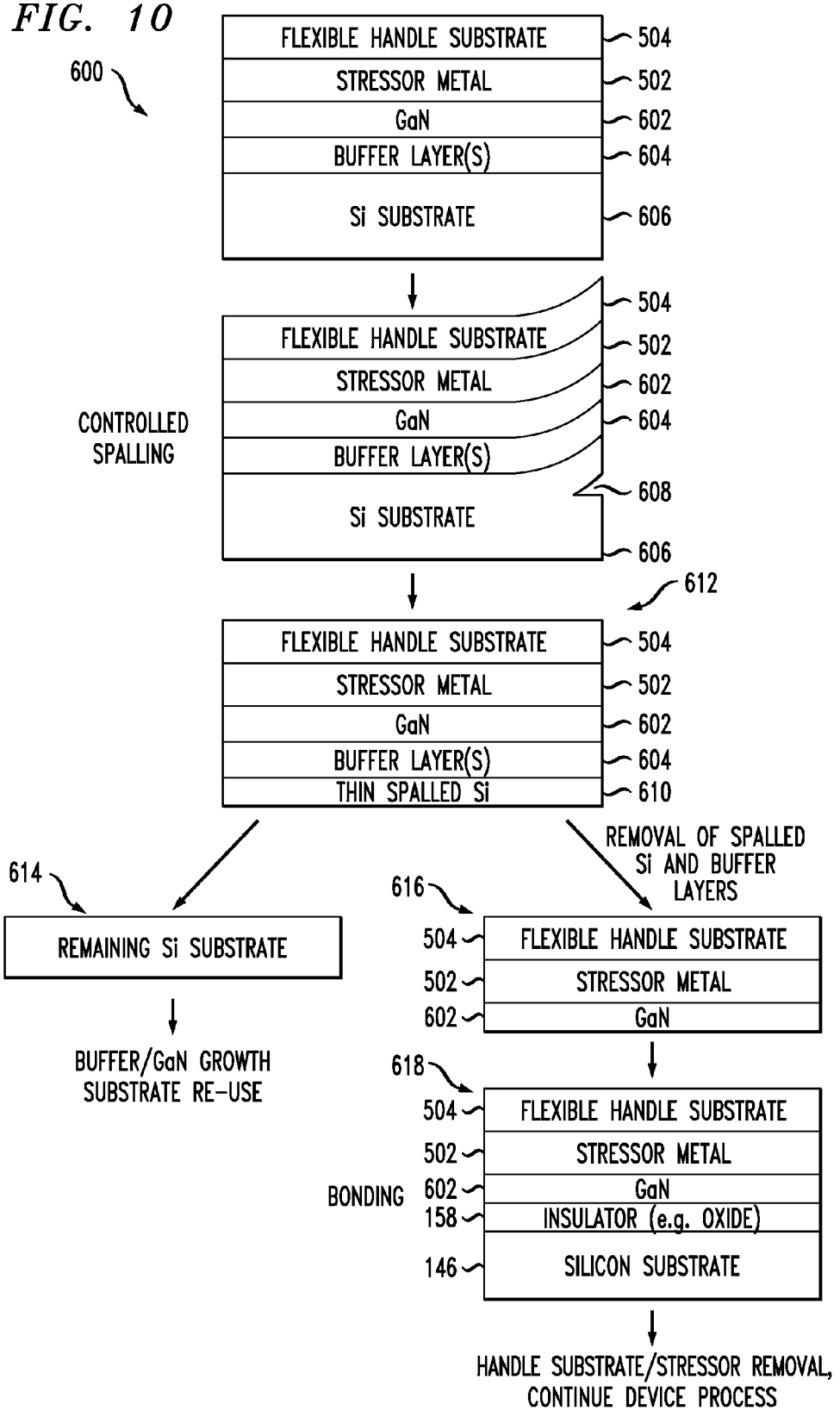
FIG. 10 is a flow diagram showing a further exemplary process for fabricating a structure useful for constructing a high electron mobility transfer structure or a Schottky diode structure.

FIGS. 9 and 10 show schematic illustrations of exemplary processes that may be used entirely or in part to fabricate one or more of the HEMT or diode structures disclosed herein, it being appreciated that other processes could instead be employed. Referring to FIG. 9, a stressor metal layer 502 and a flexible handle substrate 504 are formed on an initial substrate 506. The initial substrate may comprise, for example, gallium nitride or gallium nitride on sapphire or silicon carbide. The flexible handle substrate 504 can be a flexible adhesive. The flexible handle substrate is used to cause tensile stress in the metal layer (e.g. nickel) to form a fracture 508 in the initial substrate 504. Two elements remain following this procedure, one 510 comprising the flexible handle substrate, the stressor metal layer 502 and a thin spalled gallium nitride layer 512, the other 514 comprising the remaining portion of the initial substrate 506. If the initial substrate is gallium nitride, it can be reused by forming another stressor metal layer on it followed by formation of a flexible handle substrate. If the initial substrate is gallium nitride on sapphire or silicon carbide, a gallium nitride layer can again be grown on the remaining portion of the initial substrate followed by deposition of the stressor metal layer and flexible handle substrate prior to reuse for the same procedure.

The element 510 including the thin spalled gallium nitride layer 512 is further processed to add, for example, an insulator layer 158 and a silicon substrate layer 146 such as those described with respect to the exemplary embodiment of FIG. 4. The flexible handle substrate 504 and stressor metal layer 502 are removed from this element 516 followed by further processing to form a superjunction layer if necessary and, using the example of FIG. 4, add the barrier layer, passivation layer, and electrodes.

FIG. 10 shows a process similar to that shown in FIG. 9, but starts with a different initial structure 600 and is preferred. The initial structure 600 includes a flexible handle substrate 504 and a stressor metal layer 502 formed on a gallium nitride layer 602. A buffer layer 604 is positioned between the gallium nitride layer 602 and a silicon substrate 606 (e.g. Si(111)). As discussed above, aluminum nitride may be employed as a buffer layer. A fracture 608 is formed in the silicon substrate 606, resulting in a first structure 612 including a thin spalled silicon layer 610 and the other layers 502, 504, 602, 604 discussed above and the remaining portion 614 of the silicon substrate 606. The spalled silicon and buffer layers 604, 610 can be removed to form a third structure 616 including the gallium nitride layer, stressor metal layer and flexible handle substrate. The third structure 616 can be bonded to the oxide layer 158 to form a fourth structure 618 similar to the structure 516 shown in FIG. 9. The flexible handle substrate and stressor metal layer can be removed followed by further processing to obtain, for example, the structure shown in FIG. 4. The superjunction can be formed either before or after spalling. It is also possible to form the superjunction, grow the barrier layer, and then conduct the spalling procedure. The principles of the techniques shown in FIGS. 9 and 10 can be applied to the fabrication of the Schottky diode structures discussed above with respect to FIGS. 5-8.

Monolithic high voltage multipliers as disclosed herein include solid state components comprising high voltage (>1 KV) semiconductor diodes such as the Schottky diodes discussed above and/or gated diodes such as the high electron mobility transistor structures discussed above having drain-gate connections. They further include capacitor elements with high breakdown voltages (>1 KV) that are also formed as solid state components.

High-k dielectrics such as $AlO_x$, $HfO_x$, and $TaAlO_x$ allow relatively high capacitance over a relatively small area. (A "high-k" dielectric refers to a material with a high dielectric constant as compared to silicon dioxide, i.e. >3.9.) In an exemplary embodiment of the invention, the capacitors 104 employed in the voltage multiplier 100 include 10 nF metal-insulator-metal capacitors, each having a 2 µm $HfO_x$ insulator having an area of 1 $cm^2$. Such a capacitor allows a breakdown voltage ($V_{BR}$) of 2.5 KV or greater. Optional field plates (not shown) may be employed to avoid breakdown at edges. Using GaN Shottky diodes such as those discussed above and 10 nF high-k dielectric capacitors, both with breakdown voltages of 2.5 KV, voltage multiplication is possible from 2.5 KV (peak-to-peak) to 5 KV using a two-stage multiplier as shown in the exemplary embodiment of FIG. 1 and 10 KV using a four stage multiplier (not shown) with less than a ten percent loss for a DC load of 100 mA, under 75 KHz and 500 KHz operation, respectively.

It will be appreciated that the circuits disclosed herein can be physical structures such as the solid state monolithic voltage multipliers discussed above, or embodied in computer readable descriptive form suitable for use in subsequent design, test or fabrication stages as well as in resultant fabricated semiconductor integrated circuits. Computer readable encodings and representations of the circuits disclosed herein, whether embodied in media or combined with suitable reader facilities to allow fabrication, test, or design refinement of the corresponding circuits and/or structures, are accordingly contemplated by the teachings herein. As used herein, a computer readable medium includes at least disk, tape, or other magnetic, optical, semiconductor (e.g. flash memory cards, ROM) or electronic medium, and a network, wireline, wireless or other communications medium.

Figure 11:
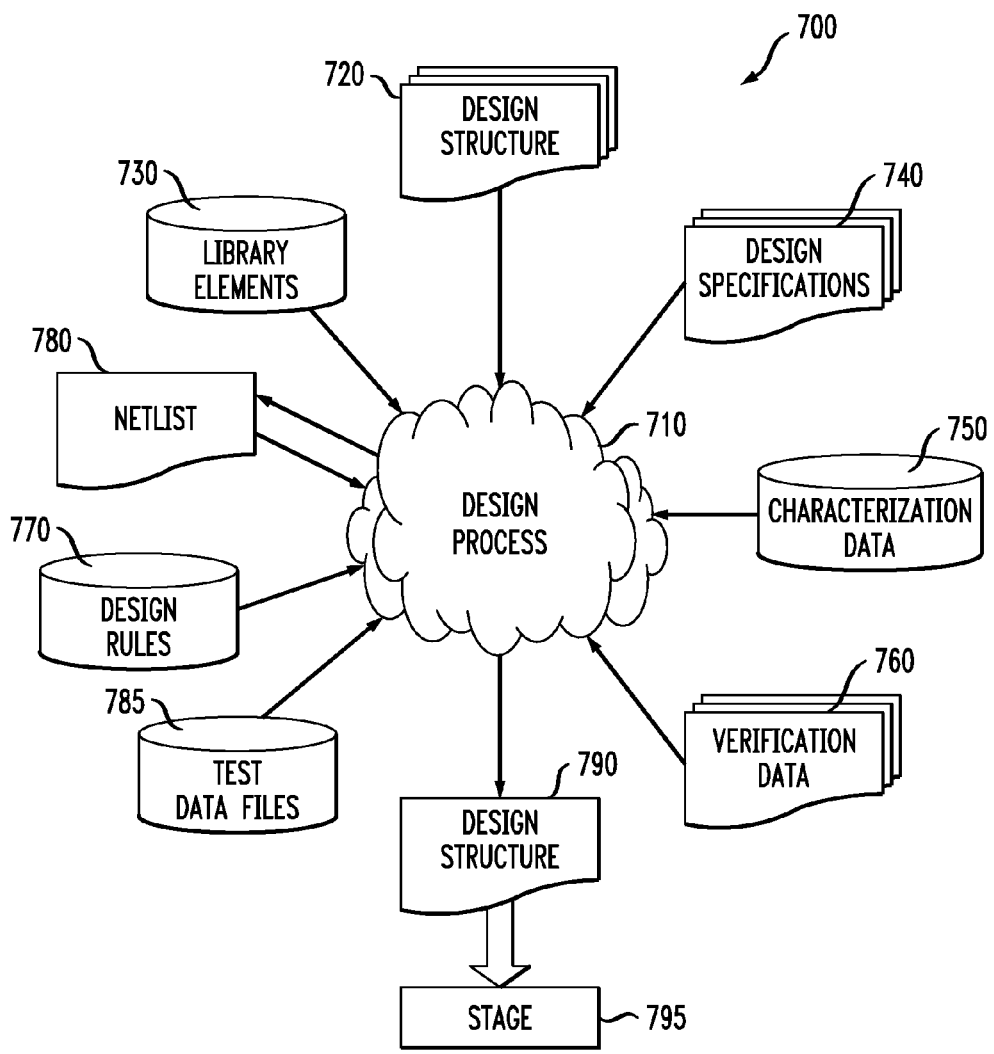
FIG. 11 is a flow diagram of a design process used in integrated circuit design, manufacture, and/or test.

FIG. 11 shows a block diagram of an exemplary design flow 700 used for example, in semiconductor IC logic design, simulation, test, layout, and manufacture. Design flow 700 includes processes and mechanisms for processing design structures or devices to generate logically or otherwise functionally equivalent representations of the design structures and/or devices described above and shown in FIG. 1. The design structures processed and/or generated by design flow 700 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® R Inc. or Xilinx® Inc.

FIG. 11 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as that shown in FIG. 1. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIG. 1 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 790 may comprise a compiled, executable HDL simulation model that functionally simulates the device shown in FIG. 1.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 790 may then proceed to a stage 795 where, for example, design structure 790: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Given the discussion thus far, it will be appreciated that, in general terms, an exemplary solid state monolithic voltage multiplier is provided, FIG. 1 showing a specific example of a solid state monolithic device for multiplying voltage. The structure includes a voltage input, a voltage output, a plurality of high-voltage semiconductor diodes, a plurality of metal-insulator-metal or metal-insulator-semiconductor high-k capacitors, and pathways electrically connecting the diodes and capacitors such that the diodes 102, capacitors 104 and pathways are configured as a network to convert AC electrical power having a first voltage to a higher second DC voltage. The diodes 102 in one exemplary embodiment are diode connected high electron mobility transistor structures that include a doped gallium nitride superjunction layer 44 or 144 having a plurality of p/n junctions. A barrier layer adjoins the doped gallium nitride superjunction layer, the doped gallium nitride superjunction layer being positioned between a substrate layer 46 or 146 and the barrier layer 42 or 142. The gate and drain electrodes (50, 54 or 150, 154) are electrically connected when such structures are employed as the diodes 102.

Schottky diodes are employed as the diodes 102 in accordance with further exemplary embodiments, such as the diodes shown in FIGS. 5-8. An exemplary Schottky diode structure includes a Schottky contact 250, 250', a substrate 206, 246 having a top surface 206', 246', and a doped gallium nitride superjunction layer 204, 244 between the Schottky contact and the top surface of the substrate. The doped gallium nitride superjunction layer has a thickness of less than ten microns and comprises a plurality of p/n junctions (e.g. 244'). The entirety of the thickness of the doped gallium nitride superjunction layer 204, 244 comprises a superjunction structure. The p/n junctions extending vertically with respect to the top surface of the substrate as illustrated in FIGS. 5 and 6. As shown in FIG. 6, an insulating layer 258 may be provided between the substrate and superjunction layers. Gallium nitride Schottky diodes lacking the superjunction structure, such as the diode 300 shown in FIG. 8, may alternatively be employed as one or more of the diodes 102 in the multiplier 100. A manufacturer would likely choose to employ the same types of diodes or diode-connected transistors when fabricating the voltage multipliers disclosed herein, though in theory different types of high voltage semiconductor diodes could be used in the same voltage multiplier circuit. The multiplier may be a two-stage multiplier as shown in FIG. 1 or other such multistage configuration. The breakdown voltage of the multiplier including the components as described herein preferably exceeds 2 KV.

A design structure tangibly embodied in a machine-readable medium for designing, manufacturing, or testing an integrated circuit is provided in accordance with a further aspect as described above with respect to FIG. 11. The design structure includes a voltage input, a voltage output, a plurality of high-voltage semiconductor diodes, a plurality of metal-insulator-metal or metal-insulator-semiconductor high-k capacitors, and pathways electrically connecting the diodes and capacitors. The diodes, capacitors and pathways are configured as a network to convert AC electrical power having a first voltage to a higher second DC voltage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A solid state monolithic voltage multiplier comprising:
a voltage input;
a voltage output;
a plurality of high-voltage semiconductor diodes, each of the high-voltage semiconductor diodes comprising a doped gallium nitride superjunction layer between a Schottky contact and a top surface of a silicon substrate, the doped gallium nitride superjunction layer comprising a plurality of p/n junctions, the entirety of the thickness of the doped gallium nitride superjunction layer comprising a superjunction structure, the p/n junctions extending vertically with respect to the top surface of the silicon substrate;
a plurality of metal-insulator-metal or metal-insulator-semiconductor high-k capacitors, each of the capacitors exhibiting a breakdown voltage exceeding 1 KV;
pathways electrically connecting the diodes and capacitors,
wherein the diodes, capacitors and pathways are configured as a network to convert AC electrical power having a first voltage to a higher second DC voltage.

2. The solid state monolithic voltage multiplier of claim 1, wherein the substrate comprises Si(111).

3. The solid state monolithic voltage multiplier of claim 2, further including an insulating layer between the substrate and the gallium nitride superjunction layer of each semiconductor diode.

4. The solid state monolithic voltage multiplier of claim 1, wherein the network is configured as a multi-stage Cockcroft-Walton voltage multiplier having a breakdown voltage exceeding 2 KV.

5. The solid state monolithic voltage multiplier of claim 1 wherein
the doped gallium nitride superjunction layer has a thickness of less than ten microns.

6. The solid state monolithic voltage multiplier of claim 5, wherein each semiconductor diode further includes an insulating layer between the substrate and the doped gallium nitride superjunction layer.

7. The solid state monolithic voltage multiplier of claim 5, wherein the substrate comprises silicon (111).

8. A design structure tangibly embodied in a machine-readable medium for designing, manufacturing, or testing an integrated circuit, the design structure comprising:
a voltage input;
a voltage output;
a plurality of high-voltage semiconductor diodes, wherein the high-voltage semiconductor diodes each comprise a doped gallium nitride superjunction layer between a Schottky contact and a top surface of a silicon substrate, the doped gallium nitride superjunction layer comprising a plurality of p/n junctions, the entirety of the thickness of the doped gallium nitride superjunction layer comprising a superjunction structure, the p/n junctions extending vertically with respect to the top surface of the silicon substrate;
a plurality of metal-insulator-metal or metal-insulator-semiconductor high-k capacitors, each of the capacitors exhibiting a breakdown voltage exceeding 1 KV;
pathways electrically connecting the diodes and capacitors,
wherein the diodes, capacitors and pathways are configured as a network to convert AC electrical power having a first voltage to a higher second DC voltage.

9. The design structure of claim 8, wherein the substrate comprises silicon (111).

10. The design structure of claim 8, wherein the network is configured as a multi-stage Cockcroft-Walton voltage multiplier.

11. The design structure of claim 10, wherein the multi-stage Cockcroft-Walton voltage multiplier has a breakdown voltage exceeding 2 KV.

12. A solid state monolithic voltage multiplier comprising:
a voltage input;
a voltage output;
a plurality of high-voltage semiconductor diodes, each of the high-voltage semiconductor diodes including a diode-connected high electron mobility transistor structure, each high electron mobility transistor structure comprising a doped gallium nitride superjunction layer, each high electron mobility transistor structure further including a substrate comprised of silicon (111);
a plurality of metal-insulator-metal or metal-insulator-semiconductor high-k capacitors, each of the capacitors exhibiting a breakdown voltage exceeding 1 KV;
pathways electrically connecting the diodes and capacitors,
wherein the diodes, capacitors and pathways are configured as a network to convert AC electrical power having a first voltage to a higher second DC voltage.

13. The solid state monolithic voltage multiplier of claim 12, wherein the doped gallium nitride superjunction layer of each high electron mobility transistor structure has a thickness of less than ten microns, the entire thickness of the doped gallium nitride superconductor layer comprising a superjunction structure having vertically extending p/n junctions.

14. The solid state monolithic voltage multiplier of claim 12 wherein
a barrier layer adjoins the doped gallium nitride superjunction layer of each high electron mobility transistor structure, the doped gallium nitride superjunction layer of each high electron mobility transistor structure being positioned between the substrate and the barrier layer;
the doped gallium nitride superjunction layer being operable to suppress breakdown through the silicon substrate.

15. The solid state monolithic voltage multiplier of claim 14, wherein the barrier layer comprises an aluminum gallium nitride barrier layer adjoining the doped gallium nitride superjunction layer.

16. A design structure tangibly embodied in a machine-readable medium for designing, manufacturing, or testing an integrated circuit, the design structure comprising:

a voltage input;
a voltage output;
a plurality of high-voltage semiconductor diodes, wherein the semiconductor diodes include diode-connected high electron mobility transistor structures, each high electron mobility transistor structure comprising a silicon substrate layer and a barrier layer adjoining a doped gallium nitride superjunction layer, the doped gallium nitride superjunction layer being positioned between the silicon substrate layer and the barrier layer, the doped gallium nitride superjunction layer being operable to suppress breakdown through the silicon substrate layer;
a plurality of metal-insulator-metal or metal-insulator-semiconductor high-k capacitors, each of the capacitors exhibiting a breakdown voltage exceeding 1 KV;
pathways electrically connecting the diodes and capacitors,
wherein the diodes, capacitors and pathways are configured as a network to convert AC electrical power having a first voltage to a higher second DC voltage.

17. The design structure of claim 16, wherein the doped gallium nitride superjunction layer of each high electron mobility transistor structure has a thickness of less than ten microns, the entire thickness of the doped gallium nitride superconductor layer comprising a superjunction structure.

* * * * *